(12) United States Patent
Komatsu

(10) Patent No.: US 6,329,860 B1
(45) Date of Patent: Dec. 11, 2001

(54) CLOCK GENERATOR PRODUCING CLOCK SIGNAL QUICKLY ADJUSTED TO TARGET FREQUENCY

(75) Inventor: Yuji Komatsu, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/578,879

(22) Filed: May 26, 2000

(30) Foreign Application Priority Data

May 31, 1999 (JP) .................................................. 11-151648

(51) Int. Cl.[7] ................................ H03L 7/06; G06F 1/04
(52) U.S. Cl. ............................ 327/291; 327/105; 331/57; 331/1 A
(58) Field of Search .................................. 327/105, 156, 327/113, 106, 107; 331/14, 11, 1 A, 56, 57

(56) References Cited

U.S. PATENT DOCUMENTS

| | | | |
|---|---|---|---|
| 4,613,826 | * 9/1986 | Masuko et al. ........................ | 331/14 |
| 4,617,526 | 10/1986 | Hikawa et al. ........................ | 331/1 A |
| 5,731,741 | * 3/1998 | Ymamoto et al. ..................... | 331/11 |
| 6,204,694 | * 3/2001 | Sunter .................................... | 326/93 |

FOREIGN PATENT DOCUMENTS 6-45928   2/1994   (JP) .

OTHER PUBLICATIONS

European search report dated Oct. 4, 2000.

* cited by examiner

Primary Examiner—Dinh T. Le
(74) Attorney, Agent, or Firm—McGuireWoods LLP

(57) ABSTRACT

A frequency monitor compares an actual frequency of an oscillating circuit with a target frequency for producing a control signal representative of the comparison result, a controller is responsive to the control signal so as to trim the resistance of a resistor string with an n-bit control signal regulated through a binary search algorithm, and quickly adjusts the actual frequency to the target frequency, because the trimming operation is only repeated n times at the maximum.

12 Claims, 9 Drawing Sheets

CLOCK GENERATOR PRODUCING CLOCK SIGNAL QUICKLY ADJUSTED TO TARGET FREQUENCY

FIELD OF THE INVENTION

This invention relates to a clock generator and, more particularly, to a clock generator producing a clock signal self-adjustable to a target frequency.

DESCRIPTION OF THE RELATED ART

A voice recording/reproducing apparatus records voice as follows. An audio signal representative of the voice is sampled at a sampling frequency, and the discrete values are respectively converted to digital audio data codes. The digital audio data codes are compressed through ADPCM (Adaptive Differential Pulse Code Modulation), and the compressed data codes are stored in a non-volatile memory. When the voice is reproduced, the compressed data codes are sequentially read out from the non-volatile memory, and are decoded to the digital audio data codes. The decoded audio data codes are converted to an audio signal at the sampling frequency used in the recording. Thus, the prior art voice recording/reproducing apparatus requires a clock signal with the sampling frequency in the voice recording and the voice reproduction. A CR oscillating circuit and a clock generator with a ceramic oscillator are available for the prior art voice recording/reproducing apparatus.

When the manufacturer integrates the electric circuit of the prior art voice recording/reproducing apparatus on a semiconductor chip, some circuit components of the clock generator are prepared as discrete devices, and the discrete devices are connected to the semiconductor integrated circuit device where the other circuit components of the electric circuit are fabricated. If the CR oscillation circuit is used for the prior art voice recording/reproducing apparatus, high-quality resistor elements and high-quality capacitors are required, because the manufacturer needs to exactly tune the CR oscillation circuit at a target frequency. If the clock generator is used, a high-quality ceramic oscillator is required, because the manufacturer also needs to exactly tune the clock generator at a target frequency. The high-quality circuit components are so expensive that the production cost of the prior art clock generator is increased. Thus, the prior art clock generator is an obstacle against reduction of the production cost.

A solution is disclosed in Japanese Patent Publication of Unexamined Application (laid-open) No. 6-45928. The prior art clock generator disclosed therein includes an oscillator associated with a frequency controller. The oscillator has a variable capacitor, and the oscillation frequency is depending on the capacitance of the variable capacitor. The frequency controller has a frequency meter, and the frequency meter measures the current frequency of the oscillation signal. When the oscillating signal is deviated from a target frequency range, the frequency controller changes a control voltage signal applied to the variable capacitor, and makes the oscillating signal fall within the target frequency range.

FIG. 1 shows the circuit configuration of the prior art clock generator. The prior art clock generator includes an oscillator 901, a first counter 902, a crystal oscillator 903, a second counter 904, an AND gate 905, a third counter 906, a register 907 and a digital-to-analog converter 909. A binary number is stored in the register 907, and the digital-to-analog converter 909 converts the binary number to a control voltage signal 909. The control voltage signal is supplied to the oscillator 901, and the oscillator 901 varies the oscillating signal to a frequency equivalent to the magnitude of the control voltage signal.

While the oscillator 901 is oscillating the oscillation signal, the first counter 902 advances the count with each pulse of the oscillating signal. When the count reaches a predetermined value, the first counter 902 outputs a pulse, resets the count, and supplies a control signal representative of a preset value to the second counter 904. The second counter 904 advances the count with each pulse of the oscillating signal generated by the crystal oscillator 903. The oscillation signal of the crystal oscillator 903 is much higher in frequency than the oscillation signal of the oscillator 901. When the count reaches the present value, the second counter 904 changes the potential level of the output signal thereof. When the first counter 902 is reset, the present value is loaded into the second counter 904. The output signal of the second counter 904 is ANDed with the output pulse of the first counter 902. Thus, the AND gate 905 supplies a pulse signal to the third counter 906, and the third counter 906 advances the count or the binary value with the output pulse signal.

A problem is encountered in the prior art clock generator shown in FIG. 1 in that a long time period is consumed for a trimming operation. This is because of the fact that the measurement of the frequency is repeated $2^{N+1}$ times until the trimming is completed.

SUMMARY OF THE INVENTION

It is therefore an important object of the present invention to provide a clock generator, in which an oscillating frequency is quickly trimmed.

In accordance with one aspect of the present invention, there is provided a clock generator comprising an oscillating circuit having a parameter and generating an output clock signal variable in frequency depending upon the parameter, a frequency monitor responsive to a basic clock signal so as to measure an actual frequency of the output clock signal and comparing the actual frequency with a target frequency for producing a control signal representative of a result of comparison and a trimming circuit connected between the frequency monitor and the oscillating circuit and responsive to the control signal so as to change the parameter through a binary search.

BRIEF DESCRIPTION OF THE DRAWINGS

The features and advantages of the clock generator will be more clearly understood from the following description taken in conjunction with the accompanying drawings in which.

DESCRIPTION OF THE PREFERRED EMBODIMENTS

First Embodiment

Figure 1:
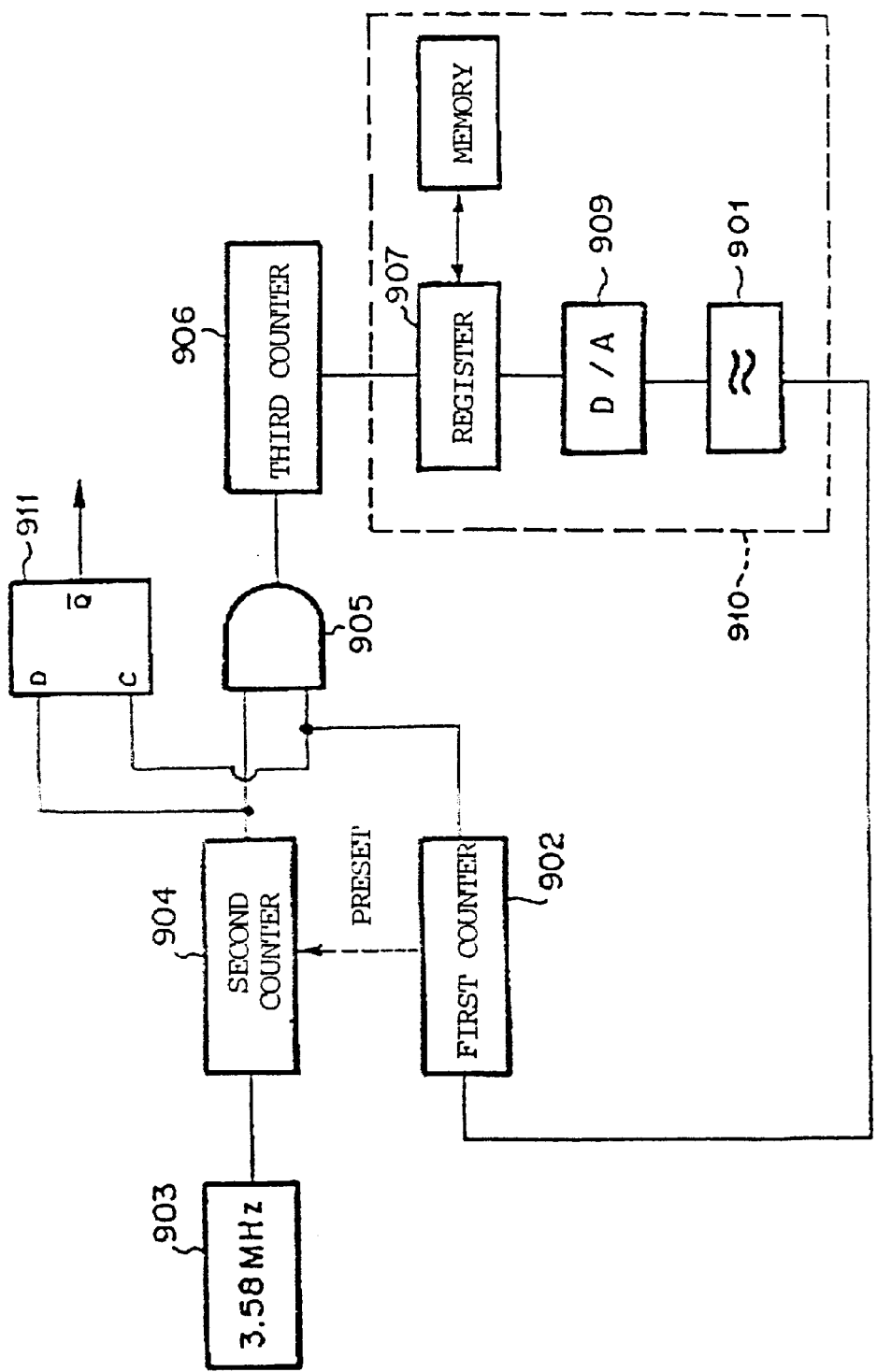
FIG. 1 is a block diagram showing the circuit configuration of the prior art clock generator disclosed in Japanese Patent Publication of Unexamined Application No. 6-45928.
Figure 2:
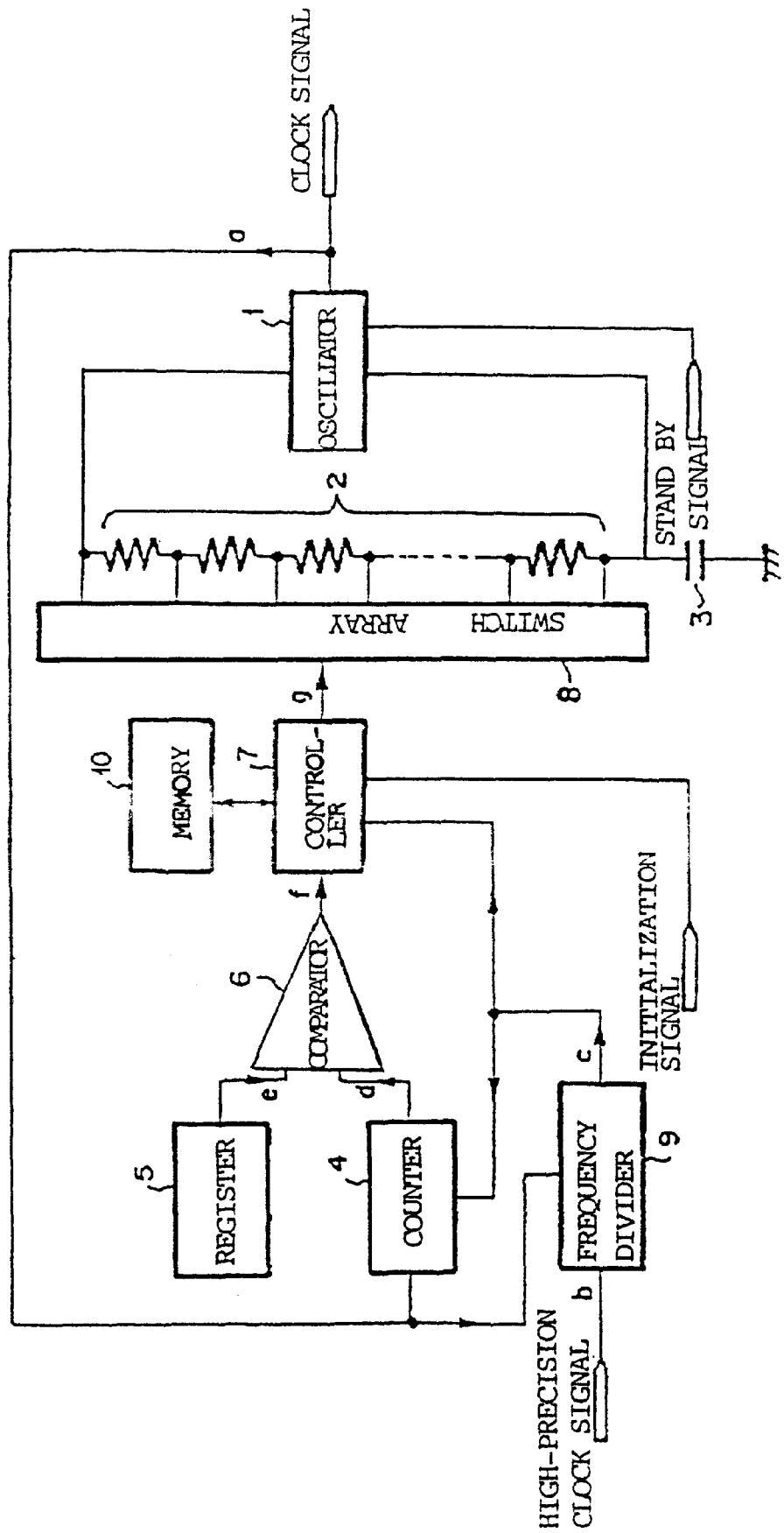
FIG. 2 is a block diagram showing the circuit configuration of a clock generator according to the present invention.

Referring to FIG. 2 of the drawings, a clock generator embodying the present invention comprises an oscillator 1, a resistor string 2, a condenser 3, a counter 4, a register 5, a comparator 6, a trimming controller 7, a switch array 8, a frequency divider 9 and a non-volatile memory 10.

The oscillator 1, the resistor string 2 and the condenser 3 form in combination an oscillating circuit, and the oscillating circuit outputs a clock signal a. The resistor string 2 and the condenser 3 are not high-quality products, but are standard products. There is a non-ignoreable dispersion in the standard product, and, accordingly, the oscillating frequency can not be guaranteed. The clock signal a is supplied from the oscillating circuit to the clock counter 4 and the frequency divider 9.

Figure 3:
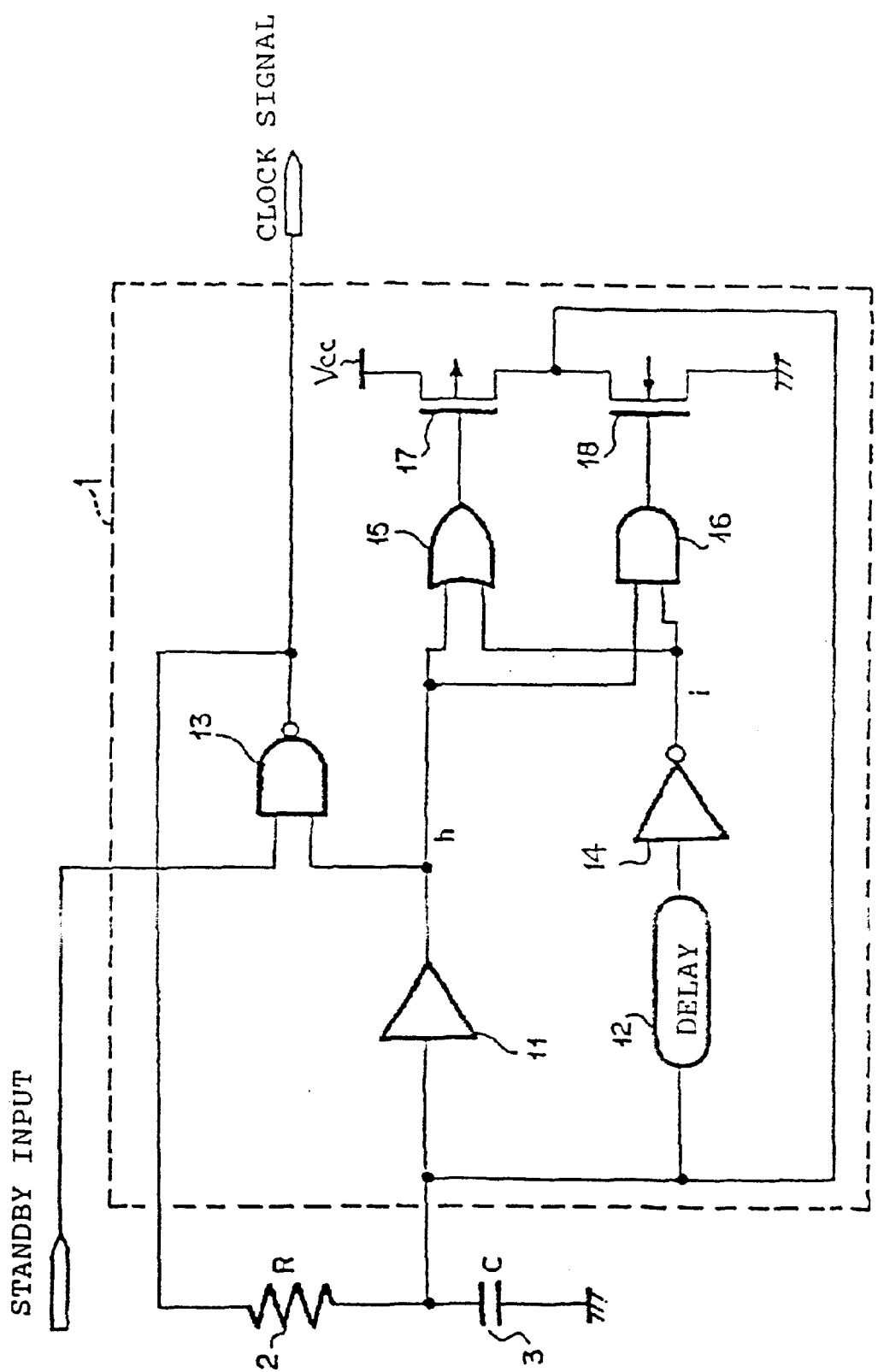
FIG. 3 is a block diagram showing the circuit configuration of an oscillator incorporated in the clock generator.

Turning to FIG. 3 of the drawings, the oscillator 1 includes a Schmitt trigger circuit 11, a delay circuit 12, a NAND gate 13, an inverter 14, an OR gate 15, an AND gate 16, a p-channel enhancement type field effect transistor 17 and an n-channel enhancement type field effect transistor 18 are connected in series between a power voltage line Vcc and a ground line, and form three-state buffer circuit together with the OR gate 15 and the AND gate 16.

The intermediate node between the resistor string 2 and the condenser 3 is connected to the input node of the Schmitt trigger circuit 11, the input node of the delay circuit 12 and the common drain node between the p-channel enhancement type field effect transistor 17 and the n-channel enhancement type field effect transistor 18. The Schmitt trigger circuit 11 supplies a pulse signal h to the input node of the NAND gate 13, the input node of the OR gate 15 and the input node of the AND gate 16. A standby signal is connected to the other input node of the NAND gate 13, and the NAND gate 13 generates the clock signal a. The clock signal a is output, and is further supplied to the resistor string 2.

The delayed signal is supplied from the delay circuit 12 to the inverter 14, and the inverted signal i is supplied to the other input node of the OR gate 15 and the other input node of the AND gate 16. The p-channel enhancement type field effect transistor 17 and the n-channel enhancement type field effect transistor 18 complementarily turn on and off. Thus, the three-state buffer circuit 15/16/17/18 selectively couples the power voltage Vcc, the ground voltage and the high-impedance to the intermediate node between the resistor string 2 and the condenser 3.

The resister string 2 and the condenser 3 form in combination a CR oscillator, the behavior of which is well known to person skilled in the art. The capacitor 3 is repeatedly charged and discharged, and the CR oscillator oscillates a frequency inversely proportional to the product between the capacitance C and the resistance R.

Turning back to FIG. 2, a high-precision clock signal b is further supplied to the frequency divider 9. The high-precision clock signal b may be generated by a crystal oscillator. The frequency divider 9 supplies a reference clock signal c at constant time intervals to a reset node of the counter 4 and an enable node of the controller 7. The controller 7 is activated with the reference clock signal c and the counter 4 is initialized with the reference clock signal c.

The counter 4 advances the count stored therein with each of the pulses of the clock signal a, and the count is indicative of the number of the pulses supplied to the counter 4 in the constant time interval. A piece of data is representative of a target frequency, and is stored in the register 5. The register 5 supplies a data signal e representative of the target frequency to an input node of the comparator 6, and the counter 4 supplies a data signal d representative of the count to the other input node of the comparator 6. The comparator 6 compares the count with the target frequency, and produces a control signal f representative of the comparison result. The control signal f is indicative of the difference between the count and the target frequency. The control signal f is supplied to the controller 7. The controller 7 produces a multi-bit control signal g representative of a binary value, and is supplied to the switch array 8. With the control signal g, the switch array 8 selectively changes the taps incorporated therein so as to trim the resistance of the resister string 2.

The trimming is achieved by changing the resistance of the resistor string 2. The resistor string 2 has resistive elements which are weighted by $2^n$ where n is 0, 1, 2, ... N, i.e., 1, 2, 4 ... $2^N$. The binary search algorithm is employed in the controller 7. The controller 7 determines the control signal g from the most significant bit toward the least significant bit through the binary search algorithm. Thus, the measurement of the frequency is repeated only N times.

Figure 4:
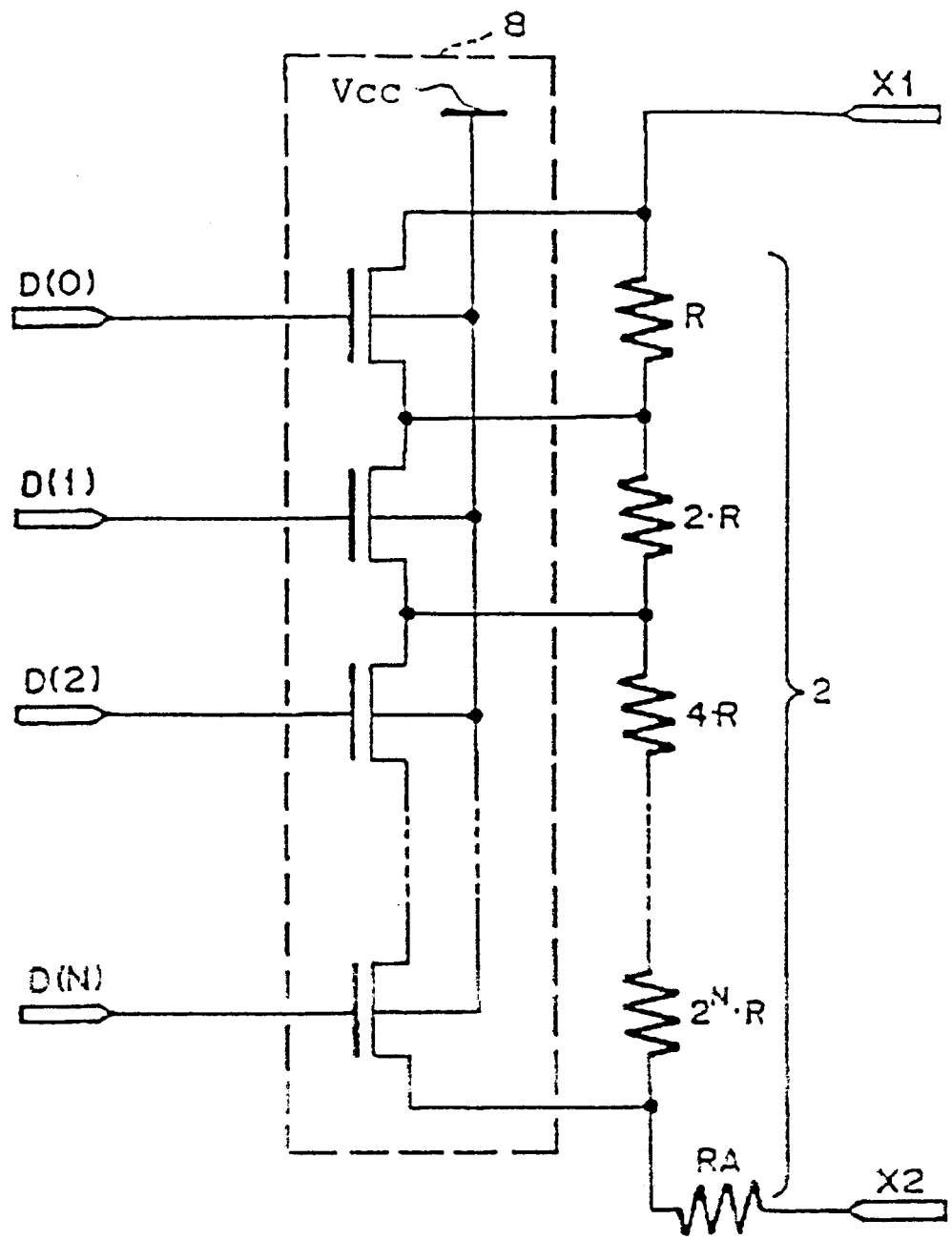
FIG. 4 is a circuit diagram showing the circuit configuration of a switch array and a resistor string both incorporated in the clock generator.

FIG. 4 shows the circuit configuration of the switch array 8 connected to the resistor string 2. The switch array 8 is implemented by a series of p-channel enhancement type switching transistors. The series of p-channel enhancement type switching transistors has common nodes respectively connected to tap nodes between the resistive elements R, 2R, 4R, ... $2^N$R, RA of the resistor string 2. The control signal g has signal bits D(0), D(1), D(2), ... D(N), which are respectively applied to the gate electrodes of the p-channel enhancement type switching transistors. Even though the trimming value is zero, the resistive element RA prevents the oscillating circuit 1/2/3 from stop of the oscillation.

Figure 5:
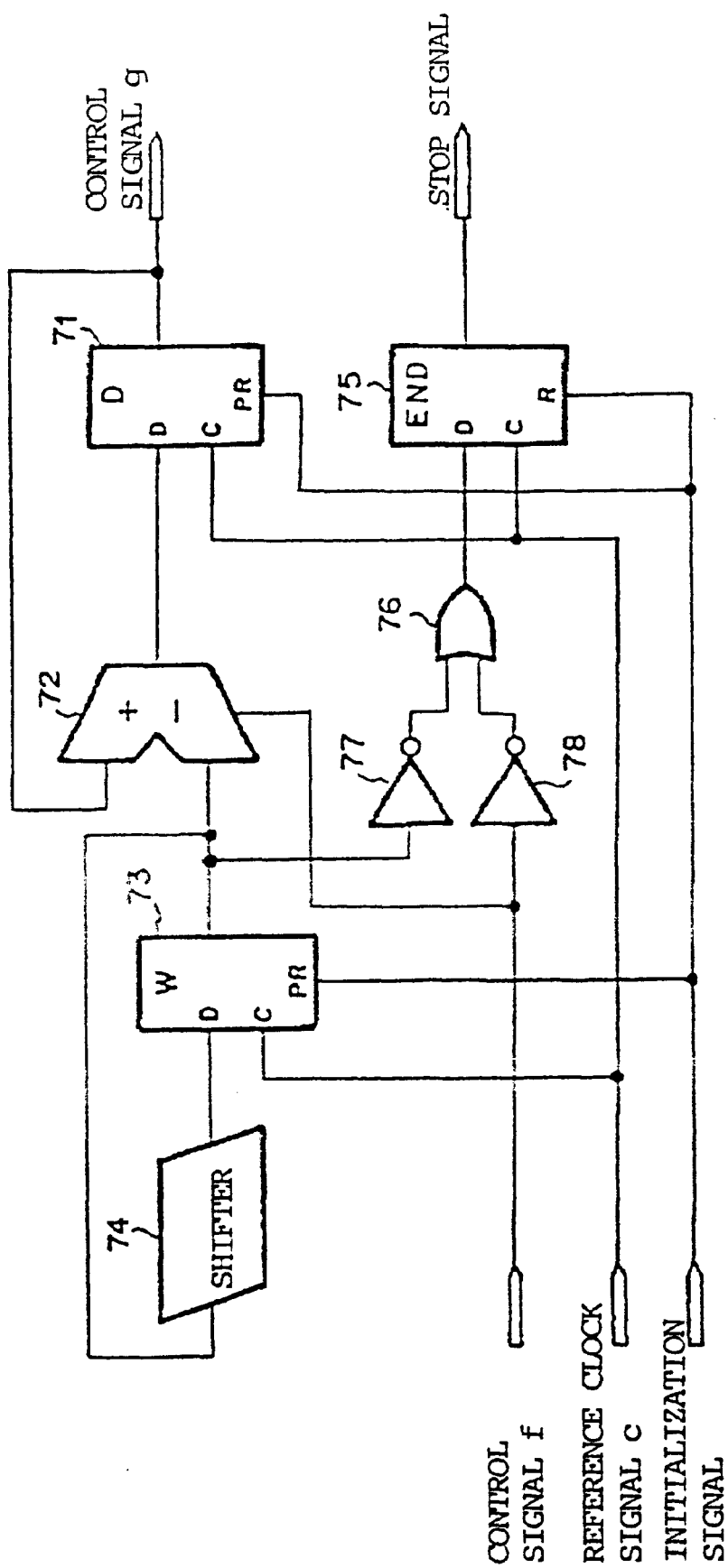
FIG. 5 is a block diagram showing the circuit configuration of a controller incorporated in the clock generator.

FIG. 5 shows the circuit configuration of the controller 7. The controller includes a trimming register 71, an adder/subtracter 72, a weight register 73, a shifter 74, an end register 75, an OR gate 76 and inverters 77/78. The trimming value N is stored in the trimming register 71, and the trimming register 71 outputs the control signal g, and the control signal g consists of N+1 signal bits D(0) to D(N) representative of the trimming value N. The adder/subtracter 73 is responsive to the control signal f so as to calculate the sum/difference between the trimming value N and a weight W, and the sum/difference is supplied to the trimming register 71 as the trimming value N. Upon completion of the trimming operation on one of the bits, the shifter 74 rightwardly shifts the weight W, and decreases the weight W to a half of the previous value. The weight register 73 is connected through the inverter 77 to one of the input nodes of the OR gate 76, and the control signal f is supplied through the inverter 78 to the other input node of the OR gate 76. When the control signal f is indicative of the consistence, or when the weight is decreased to zero, the OR gate 76 changes the output signal to logic "1" level, and supplies the output signal to the end register 75. The end register 75 stores the logic level of the output signal supplied from the OR gate 76, and outputs a stop signal. The trimming register 71, the weight register 73 and the end register 75 are initialized with an initialization signal before the trimming operation, and the weight register 73 restores the value.

After the trimming through the binary search, if the high-precision clock signal b is still supplied to the frequency divider 9, the frequency tracking is repeated at the constant intervals through the regulation of the switch array 8.

On the other hand, if the high-precision clock signal b is stopped after the clock signal a is adjusted to the target frequency, the controller 7 keeps the control signal g at the current binary number, and, accordingly, the resistor string 2 continuously offers the appropriate resistance to the oscillating circuit. In this instance, the controller 7 stores the binary value in the non-volatile memory 10 before the power switch turns off. When the clock generator is powered, again, the controller 7 reads out the binary number from the non-volatile memory 10, and adjusts the control signal g to the binary number without any assistance of the other circuits 4/5/6/9. In other words, the high-precision clock is only required once.

The clock generator implementing the first embodiment may be integrated on a semiconductor chip. In this instance, the crystal oscillating element may be connected to the integrated circuit so as to form a built-in crystal oscillator.

Figure 6:
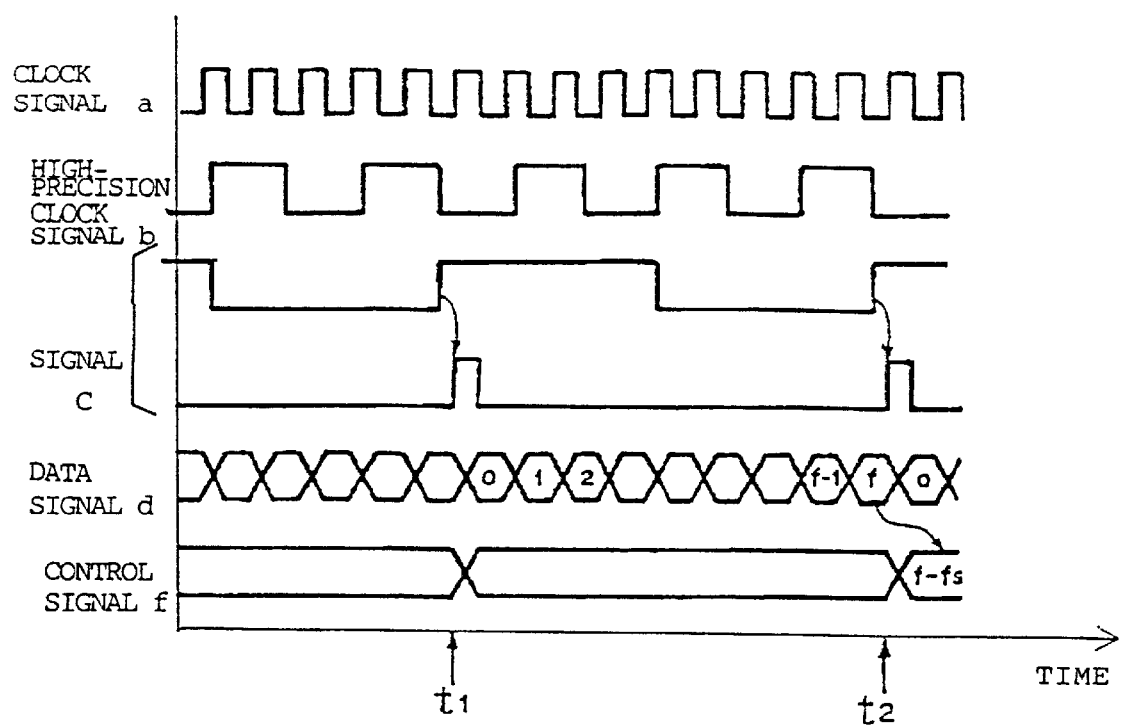
FIG. 6 is a timing chart showing the behaviors of a clock counter, a frequency register, a comparator 6 and a frequency divider incorporated in the clock generator.

Description is hereinbelow made on the circuit behavior of the clock generator with reference to FIG. 6. FIG. 6 shows the circuit behaviors of the clock counter 4, the register 5, the comparator 6 and the frequency divider 9. The high-precision clock signal b is an asynchronous pulse signal, and is supplied to the frequency divider 9. The frequency divider 9 divides the high-precision clock signal b so as to change the pulse period. The frequency divider 9 outputs the reference clock signal c at t1/t2. The clock counter 4 is reset to zero with the reference clock signal c, and advances the count with the pulses of the clock signal a. For this reason, the data signal d is incremented by one at the pulse rise of the clock signal a.

The target frequency is assumed to be fs. The register 5 supplies the control signal e representative of the target frequency fs to the comparator 6. The comparator 6 is responsive to the reference clock signal c so as to produce the control signal f representative of the difference between the count and the target frequency fs. The control signal f is indicative of the difference (f−fs) at time t2. Thus, the counter 4, the register 5, the comparator 6 and the frequency divider 9 as a whole constitute a frequency monitor, which produces the control signal f representative of the comparison result.

The actual frequency f of the clock signal a is trimmed as $$F=fex \times fs/m$$

where fex is the frequency of the high-precision clock signal b and m is the dividing ratio. The dividing ratio m is appropriately given to the frequency divider 9 in consideration of the frequency fex of the high-precision clock signal b. In other words, the target frequency fs is independent of the frequency fex of the high-precision clock signal b. A built-in oscillator on semiconductor integrated circuit devices usually produces a clock signal at 32.768 KHz, and is available for the clock generator as the high-precision clock signal b.

Figure 7:
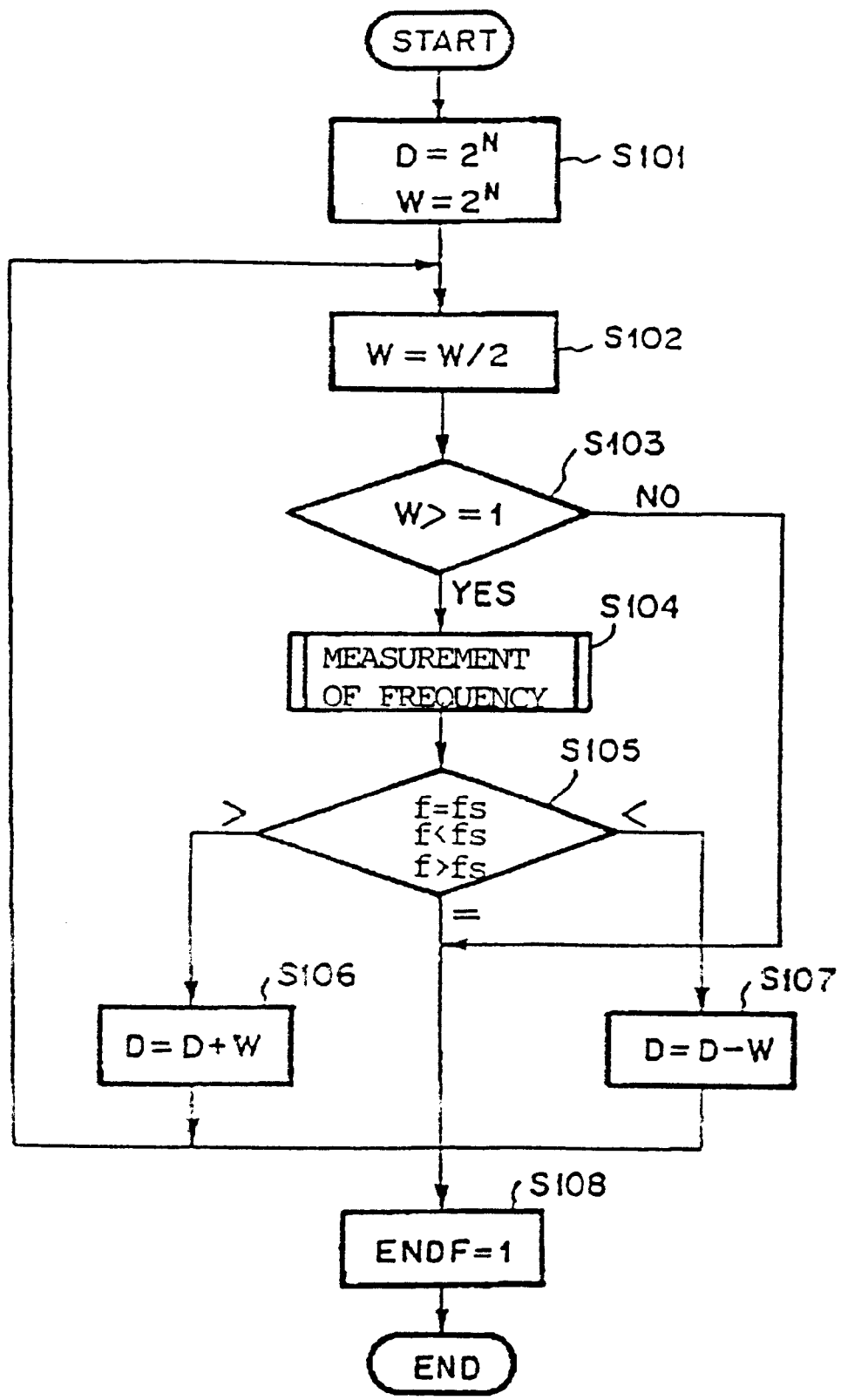
FIG. 7 is a flowchart showing a trimming operation carried by the controller.

Subsequently, the trimming operation is described with reference to FIG. 7. As described hereinbefore, the controller 7 produces the N+1 bit control signal g, and supplies it to the p-channel enhancement type switching transistors of the switch array 8. When the controller 7 is enabled with the reference clock signal c, the controller 7 starts a program sequence shown in FIG. 7. The registers 71/73 are initialized with the reference clock signal c, and the trimming value D and the weight W stored therein are changed to $2^N$ as by step S101. After the initialization, the controller 7 repeats the trimming operation for the signal bits in bit-by-bit fashion through the binary search algorithm.

Firstly, the shift register 74 decreases the weight W to a half of the value stored in the weight register 73 through the rightward shifting operation, and stores the new weight W/2 in the weight register 73 as by step S102. When the new weight W/2 is stored in the weight register 73, it serves as the weight W in the following steps.

Subsequently, the controller 7 checks the weight W to see whether or not the weight W is equal to or greater than 1 as by step S103. When the weight W is decreased to 1, the controller 7 carries out the trimming operation for the least significant bit. If the weight W is zero, the controller 7 determines that the trimming operation is completed, and the answer at step S103 is given negative. However, when the weight W is equal to or greater than 1, the answer at step S103 is given affirmative, and the controller 7 proceeds to step S104.

The frequency monitor 4/5/6 compares the count f with the target frequency fs, and supplies the control signal f representative of the comparison result to the controller 7 in step S104. The controller 7 checks the comparison results to see whether the count f is equal to, greater than or less than the target frequency fs as by step S105.

If the count f is greater than the target frequency fs, the adder/subtracter 72 adds the weight W to the trimming value D as by step S106. If the count f is less than the target frequency, the adder/subtracter 72 subtracts the weight W from the trimming value D as by step S107.

Upon completion of the calculation at step S106 or S107, the controller 7 returns to step S102, and reiterates the loop consisting of steps S102 to S107 until the count f is equal to the target frequency fs. The controller 7 sequentially changes the bit signals D(0) to D(N) through the loop representative of the single trimming operation.

The resistance R of the resister string 2 is given as R=RA+RB*D. The trimming value D is calculated as D=D$(0)*2^0+D(1)*2^1+D(2)*2^2+ \ldots +D(N)*2^N$. The trimming range is as wide as W.

When the controller 7 admits the clock signal a is oscillating at the target frequency fs, the controller 7 proceeds from step S105 to S108, and finishes the trimming operation. Thus, the controller 7 repeats the trimming operation N times at the maximum until the clock signal a is adjusted to the target frequency fs.

In the tracking, value 1 is stored in the weight register 73, and the adder/subtracter 72 calculates the sum or the difference between the output value of the trimming register 71 and the output value of the weight register 73 depending upon the control signal f when the enable signal is changed to the active level.

The trimming value D is stored in the trimming register 71, and the trimming register 71 keeps the current trimming value D in so far as the controller 7 does not repeat the trimming operation.

In the first embodiment, the controller 7, the switch array 8 and the non-volatile memory 10 as a whole constitute a trimming circuit.

As will be understood from the foregoing description, even though the standard circuit components 2/3 are used in the oscillating circuit, the controller 7 makes the switch array 8 adjust the resistance of the resistor string 2 through the binary search algorithm, and the oscillating circuit 1/2/3 outputs the clock signal a at the target frequency.

If the high-precision clock signal b is continuously supplied to the frequency divider 9, the clock signal a is periodically checked to see whether or not the current frequency is deviated from the target frequency, and carries out the trimming for regulating the current frequency to the target frequency. On the other hand, if the high-precision clock signal b is stopped, the controller 7 keeps the control signal g at the binary number so that the resistor string 2 fixes the resistance to the appropriate value.

Second Embodiment

Another clock generator embodying the present invention is similar in circuit configuration to the first embodiment except the oscillating circuit. For this reason, description is focused on the oscillating circuit incorporated in the clock generator implementing the second embodiment.

Figure 8:
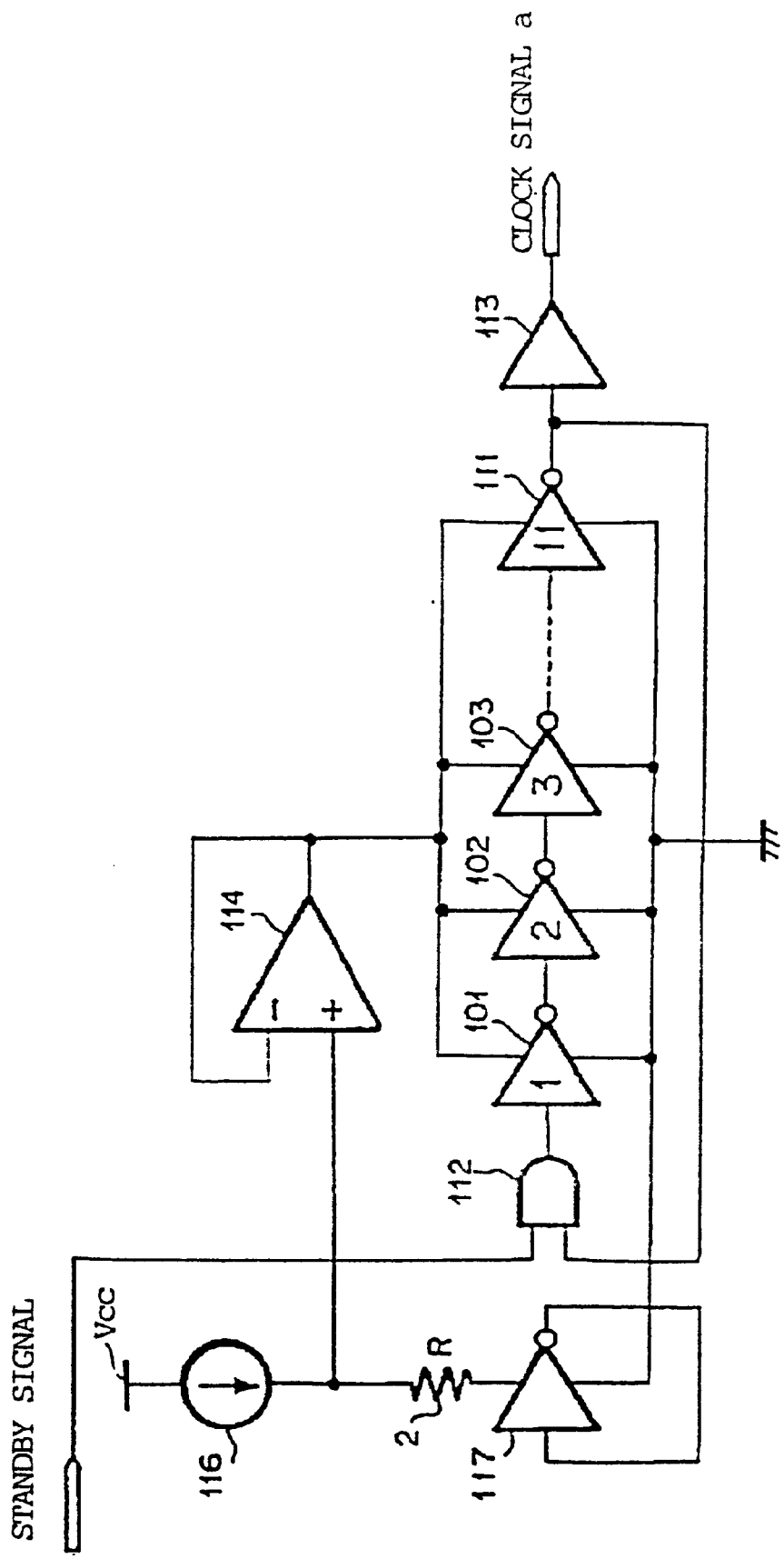
FIG. 8 is a circuit diagram showing the circuit configuration of an oscillator incorporated in another clock generator according to the present invention.

FIG. 8 shows the circuit configuration of the oscillating circuit incorporated in the second embodiment. The oscillating circuit includes a series of CMOS inverters 101, 102, 103, . . . and 111, an AND gate 112, an output buffer 113, a regulator 114, a constant current source 116, the resistor string 2 and an inverter 117. The CMOS inverters 101 to 111 are connected in series, and form in combination a ring oscillator. The final CMOS inverter 111 is connected to the output buffer 113 and an input node of the AND gate 112. The output buffer 113 generates the clock signal a. The standby signal is supplied to the other input node of the AND gate 112. When the standby signal is representative of standby, the AND gate 112 interrupts the feedback current from the final CMOS inverter 111 to the first CMOS inverter 101, and the ring oscillator 101–111 stops the oscillation. The regulator 114 applies a gate potential to the CMOS inverters 101 to 111, and the constant current source 116, the resistor 2 string and the inverter 117 give a reference voltage to the regulator 114. The resistance R of the register string 2 is trimmed by the switch array 8. The output node of the inverter 117 is connected to the input node thereof, and the node connected to the resistor string 2 is regulated to a potential level equal to the sum of the gate-to-source voltage of the p-channel enhancement type field effect transistor and the gate-to-source voltage of the n-channel enhancement type field effect transistor both incorporated in the inverter 117.

Figure 9:
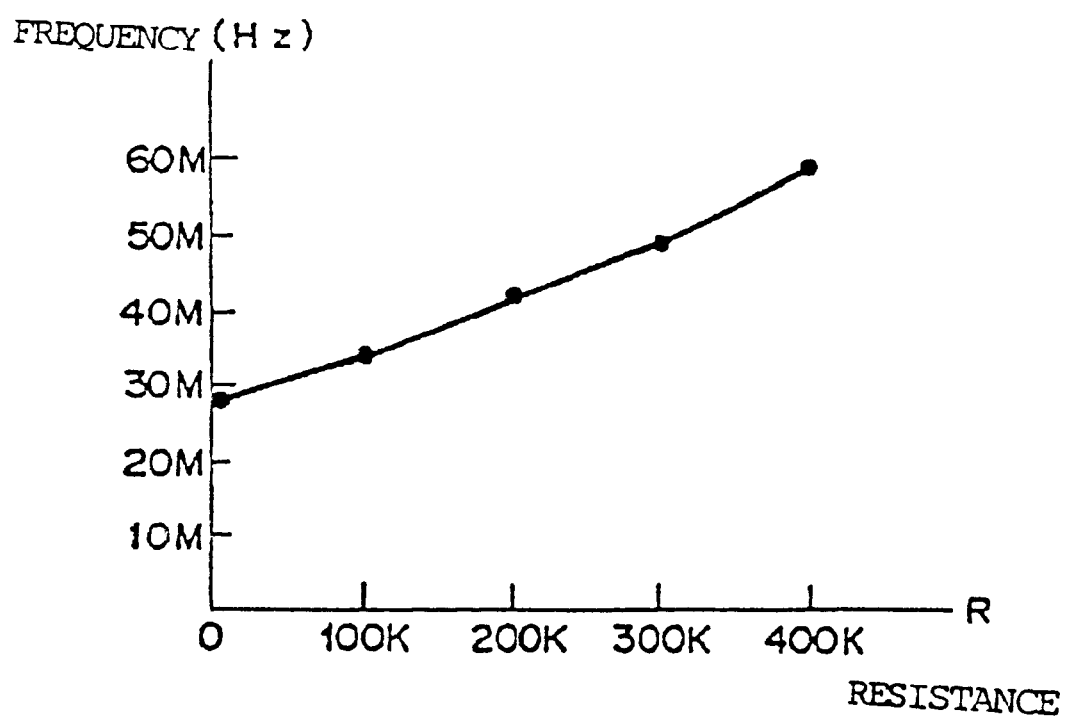
FIG. 9 is a graph showing relation between the resistance of the resistor string and the frequency of the clock signal.

In this instance, the ring oscillator 101–111 can output an extremely high-frequency clock signal a. The frequency regulation is achieved by changing the gate potential applied to the CMOS inverters 101–111. This feature is desirable, because the current consumption is reduced. The reference voltage is dependent on the gate-to-source voltage of the component transistors of the inverter 117. Dispersion of the threshold voltage and temperature dependency are less liable to have influences on the oscillation frequency before the trimming. Since the constant current source 116 flows an extremely small amount of constant current through the resistor string 2, the output voltage Vo of the regulator 114 exhibits the resistance linearly varied. This results in that the oscillation frequency of the ring oscillator 101–111 is linearly varied with the resistance R as shown in FIG. 9.

In this instance, if the count or the actual frequency f is less than the target frequency fs, the controller 7 increases the trimming value D. The gate voltage is continuously applied to the gate electrodes of the CMOS inverters 101–111 after the trimming, and, for this reason, the clock generator restarts the oscillation immediately after the removal of the standby signal.

As will be appreciated from the foregoing description, the frequency monitor 4/5/6 and the controller 7 carries out the trimming operation through the binary search so as to regulate the resistance of the register string 2 and, accordingly, the oscillating frequency of the oscillating circuit to the target values. Only the high-precision clock b is supplied from the outside of the semiconductor chip. Even if the standard produces are used as the register string 2 and the condenser 3, the clock signal a is adjusted to the target frequency fs through the trimming operation repeated N times at the maximum. Thus, the clock generator according to the present invention is economical and quickly adjusts the clock signal a to the target frequency fs.

The target frequency fs is variable with two factors, the dividing ratio and the frequency of the high-precision clock signal b. Even if the frequency of the high-precision clock signal b is unchanged, the manufacture can design the clock generator by selecting the other factor.

The reference clock signal c is produced from the high-precision clock signal b through the frequency dividing. This means that if the high-precision clock signal b stops, the frequency monitor 4/5/6/ and the controller 7 are deactivated. This results in reduction of the power consumption.

In the embodiment, the CR oscillating circuit is a kind of astable multi-vibrator, and stops the oscillation with the standby signal. Current is consumed only for storing the trimming value during the standby. When the standby signal is removed, the oscillation is immediately restarted.

Although particular embodiments of the present invention have been shown and described, it will be apparent to those skilled in the art that various changes and modifications may be made without departing from the spirit and scope of the present invention.

What is claimed is:

1. A clock generator comprising:
   an oscillating circuit having a parameter and generating an output clock signal variable in frequency depending upon said parameter;
   a frequency monitor responsive to a basic clock signal so as to measure an actual frequency of said output clock signal and comparing said actual frequency with a target frequency for producing a control signal representative of a result of comparison; and
   a trimming circuit connected between said frequency monitor and said oscillating circuit and responsive to said control signal so as to change said parameter through a binary search algorithm,
   wherein said frequency monitor includes:
      a frequency divider supplied with said basic clock signal for producing a reference clock signal;
      a counter counting pulses of said output clock signal supplied thereto in a time period defined by said reference clock signal for measuring said actual frequency;
      a register storing said target frequency; and
      a comparator having input nodes connected to said counter and said register and producing said first control signal representative of a result of comparison and supplied from an output node thereof to said trimming circuit.

2. A clock generator comprising:
   an oscillating circuit having a parameter and generating an output clock signal variable in frequency depending upon said parameter;
   a frequency monitor responsive to a basic clock signal so as to measure an actual frequency of said output clock signal and comparing said actual frequency with a target frequency for producing a control signal representative of a result of comparison; and
   a trimming circuit connected between said frequency monitor and said oscillating circuit and responsive to said control signal so as to change said parameter through a binary search algorithm, wherein said oscillating circuit includes a resistive line having plural taps arranged at intervals between both ends thereof and connected to said trimming circuit so as to change said parameter.

3. A clock generator as comprising:

an oscillating circuit having a parameter and generating an output clock signal variable in frequency depending upon said parameter;

a frequency monitor responsive to a basic clock signal so as to measure an actual frequency of said output clock signal and comparing said actual frequency with a target frequency for producing a control signal representative of a result of comparison; and a trimming circuit connected between said frequency monitor and said oscillating circuit and responsive to said control signal so as to change said parameter through a binary search algorithm, wherein said trimming circuit includes:

a controller responsive to said control signal so as to determine whether or not a trimming operation through said binary search algorithm is to be continued and producing a multi-bit control signal representative of a target value of said parameter; and a switching circuit connected between said controller and said oscillating circuit and responsive to said multi-bit control signal for changing said parameter, and in which said oscillating circuit includes a resistive line having plural taps arranged at intervals between both ends thereof and connected to said switching circuit so as to change said parameter.

4. The clock generator as set forth in claim 3, in which said oscillating circuit further includes a condenser connected between one end of said resistive line and a constant voltage source and an oscillator connected between said one end of said resistive line and the other end of said resistive line for generating said output clock signal.

5. The clock generator as set forth in claim 4, in which said oscillator includes a Schmitt trigger circuit having an input node connected to said one end and an output node for outputting said output clock signal, a delay circuit having an input node connected to said one end, and an inverter connected to an output node of said delay circuit, and a three-state buffer having input nodes respectively connected to said output node of said Schmitt trigger circuit and an output node of said inverter and an output node connected to said one end.

6. The clock generator as set forth in claim 5, in which said oscillating circuit further includes a logic gate connected between said output node of said Schmitt trigger circuit and said other end of said resistive line and disabled with a standby signal for blocking said resistive line from said output clock signal.

7. The clock generator as set forth in claim 3, in which said oscillating circuit further includes a constant current source connected between a constant voltage source and one end of said resistive line, a complementary inverter connected between the other end of said resistive line and another constant voltage source different in potential level from said constant voltage source and having an input node connected to an output node thereof, a voltage regulator having an input node connected to said one end and varying an output voltage together with said parameter, a ring oscillator connected between said voltage regulator and said another constant voltage source and responsive to said output voltage of said voltage regulator for producing a preliminary output clock signal, and an output buffer connected to an output node of said ring oscillator for producing said output clock signal from said preliminary output clock signal.

8. The clock generator as set forth in claim 7, in which said oscillating circuit further includes a logic gate connected between said output node of said ring oscillator and an input node of said ring oscillator and responsive to a standby signal so as to block said input node from said preliminary output clock signal.

9. The clock generator as set forth in claim 7, in which said ring oscillator has plural complementary inverters connected in series to form a signal loop and having respective gates applied with said output voltage for changing a frequency of said preliminary output clock signal.

10. The clock generator as set forth in claim 3, in which said controller includes a weight register for storing a weight value, a trimming register storing a trimming value and producing said multi-bit control signal representative of said trimming value, an adder/subtracter having input nodes respectively connected to an output port of said weight register and an output port of said trimming register and an output port connected to an input node of said trimming register and responsive to said control signal so as to selectively carry out an addition and a subtraction between said weight value and said trimming value, and a shifter connected between said output port of said weight register and an input node of said weight register and periodically decreasing said weight value stored in said weight register to a half thereof.

11. The clock generator as set forth in claim 10, in which said weight register has a control node connected to a frequency divider forming a part of said frequency monitor and producing a reference clock signal from said basic clock signal so as to periodically fetching an output signal of said shift register in response to said reference clock signal, said frequency monitor further includes a counter counting pulses of said output clock supplied thereto in a time period defined by said reference clock signal for measuring said actual frequency, a first register storing said target frequency, and a comparator having input nodes connected to said counter and said register and producing said control signal representative of a result of comparison supplied from an output node thereof to said trimming circuit.

12. The clock generator as set forth in claim 3, in which said trimming circuit further includes a non-volatile memory for storing said multi-bit control signal.

* * * * *